United States Patent [19]
Hira et al.

[11] Patent Number: 5,970,010
[45] Date of Patent: Oct. 19, 1999

[54] SEMICONDUCTOR MEMORY DEVICE

[75] Inventors: Masayuki Hira, Dallas; Shunichi Sukegawa; Shinji Bessho, both of Plano, all of Tex.; Yasushi Takahashi, Urama, Japan; Koji Arai, Kodaira, Japan; Tsutomu Takahashi, Tachikawa, Japan; Tsugio Takahashi, Hamura, Japan

[73] Assignees: Texas Instruments Incorporated, Dallas, Tex.; Hitachi, Ltd., Japan

[21] Appl. No.: 09/116,915

[22] Filed: Jul. 17, 1998

[30] Foreign Application Priority Data

Jul. 16, 1997 [JP] Japan .................................. 9-191644

[51] Int. Cl.⁶ .................................................. G11C 7/00
[52] U.S. Cl. .................... 365/226; 365/205; 365/189.08; 365/214; 365/196; 365/194
[58] Field of Search .................................... 365/226, 205, 365/189.01, 189.08, 214, 196, 194

[56] References Cited

U.S. PATENT DOCUMENTS

| | | | |
|---|---|---|---|
| 5,491,655 | 2/1996 | Hirose et al. | 365/177 |
| 5,544,105 | 8/1996 | Hirose et al. | 365/189.11 |
| 5,734,622 | 3/1998 | Furumochi et al. | 365/233.5 |
| 5,854,508 | 12/1998 | Kajigaya et al. | 257/786 |

*Primary Examiner*—Viet Q. Nguyen
*Attorney, Agent, or Firm*—William B. Kempler; Richard L. Donaldson

[57] ABSTRACT

Controlling the timing for the overdrive of the sense amplifiers in response to the wiring length between the sense amplifiers and the power supply voltage supply nodes, and designing a reduction of the power consumption by preventing excessive overdrive of the bit lines.

The supply timing for the power supply voltage to each sense amplifier bank is controlled according to the wiring length between the supply nodes CT0, CT1, CT2 for the power supply used for the driving of the sense amplifiers and each sense amplifier bank SB0 to SB16, and since the supply time for the overdrive voltage to the sense amplifier bank SB0 at the near end is set short and the supply time for the overdrive voltage is set successively longer as it goes towards the far end, the sensing delay that originates in the voltage drop that is generated in the wiring between the supply nodes and the sense amplifier banks is compensated for, uniformity of the overdrive for the bit lines at both the far and near ends can be achieved, the excessive overdrive at the sense amplifier bank (memory cell mat) at the near end can be avoided, and by extension, a reduction of the power consumption can be realized.

8 Claims, 8 Drawing Sheets

SEMICONDUCTOR MEMORY DEVICE

FIELD OF THE INVENTION

This invention relates to a semiconductor memory device, more specifically, to a semiconductor memory device having a function that controls the pulse signal used for the sense amplifier drive, and which compensates for the length of the sense amplifier according to the voltage drop of the wiring.

BACKGROUND OF THE INVENTION

FIG. 12 shows one construction example of a memory array for a semiconductor memory device, for example, a DRAM. In FIG. 12, the memory array is constructed by means of the word lines WL0 to WL5, bit lines (or complementary bit lines) BL0, BL0_, BL1, BL1 and the memory cells $MC_{0,0}$, $MC_{0,1}$, $MC_{0,2}$, . . . , $MC_{1,4}$, $MC_{1,5}$ that are respectively connected at the intersection points of these word lines and bit lines (and complementary bit lines). In this Figure, only a portion of the memory array is shown for the purpose of explanation. The bit line pair comprising bit line BL0 and complementary bit line BL0_ are connected to the sense amplifier SA0, and the bit line pair comprising bit line BL1 and complementary bit line BL1_ are connected to the sense amplifier SA1. During memory access, the bit line and the complementary bit line comprising a bit line pair are respectively held at different voltage levels by means of the sense amplifier. For example, when the bit line BL0 is held at a high level (power supply voltage $V_{DD}$ level, the complimentary bit line BL0_ is held at a low level (common voltage $V_{SS}$ level). The word lines WL0 to WL5 are selected and driven by means of the word line drive circuit WD. In FIG. 12, the word line drive circuit WD is omitted.

The memory cells $MC_{0,0}$, $MC_{0,1}$, $MC_{0,2}$, . . . , $MC_{1,4}$, $MC_{1,5}$ are arranged at the intersection points of the word lines WL0 to WL5 and the bit lines BL0, BL0_, BL1, BL1_, respectively. As is shown in the FIG.ure, the memory cells of the DRAM, for example, the memory cell $MC_{1,1}$ is constructed by means of a single transistor $Q_{1,1}$ and a single capacitor $C_{1,1}$, the gate of transistor $Q_{1,1}$ is connected to the word line WL1, and is controlled to the ON/OFF state by means of the voltage of word line WL1. During memory access, one of the word lines among the word lines WL0 to WL5 is selected by means of the word line drive circuit WD in response to the input address signal, and since the selected word line is activated and held at a high level, the transistor for the memory cell that is connected to the selected word line is held in the ON state.

For example, if word line WL1 is selected by means of the word line drive circuit WD and held at a high level, transistor $Q_{1,1}$ of memory cell $MC_{1,1}$ is placed in the ON state. During writing, the level of the bit line is designated in response to the write data by means of the sense amplifier at the same time as the selection of the word line. For example, bit line BL1 is held at a high level (power supply voltage $V_{DD}$ level), and complementary bit line BL1_ at the low level (common voltage $V_{SS}$ level), respectively, by means of the sense amplifier SA1. By this means, the charging voltage and the charge of the capacitor $C_{1,1}$ is held as the storage data.

On the other hand, when the storage data are read from the memory cell $MC_{1,1}$, the bit line BL1 and the complementary bit line BL1_ are set beforehand via the sense amplifier SA1 to a precharge of, for example, $V_{DD}/2$, which is half of the power supply voltage $V_{DD}$. When the word line WL1 is activated by means of the word line drive circuit WD and held at a high level, the transistor $Q_{1,1}$ is placed in the ON state, the bit line BL1 and the capacitor $C_{1,1}$ are shorted, and the potential of the bit line BL1 is slightly changed in response to the accumulated charge of the capacitor $C_{1,1}$. By means of this slight potential change on the bit line BL1 being detected and amplified by means of the sense amplifier SA1, the storage data for the memory cell $MC_{1,1}$ are read.

Accompanying the change to a large capacity for the DRAM, the memory array has been further divided into multiple subarrays (memory cell matrices), and have become a construction that arranges sense amplifier banks comprising sense amplifiers on the side of each subarray. The sense amplifier banks are constructed by means of sense amplifiers of the same number as the bit line pairs for each subarray, and each sense amplifier bank is jointly used by means of sub-arrays that are arranged on both the right and left sides. Also, means of reducing the number of sense amplifiers by means of lengthening the bit lines and widening the subarrays, a reduction of the surface area that the sense amplifier banks occupy in the entire chip is accomplished, and a reduction of the chip size is accomplished. However, the deterioration of the characteristics that accompanies an increase in the resistance and parasitic capacitance of the bit lines due to their lengthening becomes a problem. Systems such as a construction in which the bit lines are changed to tiers have been proposed for purpose of handling this.

Also, along with the advances in the change to high capacity and miniaturization of the semiconductor memory devices, the miniaturization of the elements has advanced, and the change to thin films for the purpose of low voltage operations has also advanced. In order to ensure the gate voltage tolerance of the transistors that construct the memory cell, an internal voltage $V_{DL}$ that is lower than the external power supply voltage in which the external power supply voltage $V_{DD}$ has been dropped is being used inside the memory array. Accompanying this, the lowering of the access speed has become a problem with the sense amplifier. In order to avoid this, the so-called overdrive OVD system is being used, which supplies the external voltage power supply voltage $V_{DD}$ to the sense amplifier for a normal fixed period, for example, the period until the bit line has reached the memory array voltage (internal operating voltage $V_{DL}$).

Incidentally, because a voltage drop originating in the sense amplifier voltage wiring resistance appears between each memory cell mat with the above-mentioned overdrive system used in the past, even if it is within the same memory array block, the optimum sense amplifier overdrive amount is different between each memory cell mat.

For example, in the 64 Mb (megabit) DRAM used in the past, in order to ensure sufficient writing at the farthest end, the timing for the overdrive was optimized at the farthest end (worst case). By this means, the overdrive at the farthest end was ensured, but it became a surplus overdrive at the nearest end, and the surplus charge was discarded. In other words, at the sense amplifier for the near end, a voltage application was conducted that was greater than necessary during memory access, and there were disadvantages in that this invited the deterioration of the characteristics of the transistors that construct the sense amplifier, and invited an increase in the power consumption.

FIG. 13 shows the changes in the bit line voltage for the memory cell mat of the near end and far end when reading is performed. In the case of this example, the power supply voltage $V_{DD}$ is, for example, 3.3 V, and the lowered voltage $V_{DL}$ that is used within the memory array is, for example, 2.2 V. As is illustrated, before reading, the bit line BL and the complementary bit line BL- are precharged to a voltage level of one half of the internal power supply voltage $V_{DL}$, for example, 1.1 V, and after starting reading, in response to the storage data of the memory cell, for example, the bit line BL- is charged by means of the power supply voltage $V_{DD}$, and the complementary bit line BL is discharged by means of the common voltage $V_{SS}$. Since the application time for the power supply voltage $V_{DD}$ to the bit lines BL in other words, the time $T_{OVD}$ for the overdrive is sent by matrix-ching it to the sense amplifier for the farthest end, the bit line that is connected to the sense amplifier for the farthest end is properly charged to the internal power supply voltage $V_{DL}$ by means of the overdrive operation, but at the bit line BL that is connected to the sense amplifier for the near end, it is charged to a surplus due to the same overdrive time $T_{OVD}$, and when the overdrive is completed, is held at a level that is higher than the internal $V_{DL}$. Since the complementary bit line BL_ is discharged by means of the common voltage $V_{SS}$ in the case of either the far end or the near end, its voltage is about the same.

This invention was made after reviewing this information, and its purpose is to offer a semiconductor memory device in which the timing for the overdrive can be controlled in response to the arrangement positions of the memory cell matrices, the bit lines can be driven at the optimum voltage, a reduction in the power consumption can be accomplished, and the timing design for the overdrive can be simplified.

SUMMARY OF THE INVENTION

In order to achieve the above-mentioned purposes, the semiconductor memory device of this invention has a first, second, and third voltage supply node for the purpose of providing a first voltage, a second voltage that is a higher than the above-mentioned first voltage, and a third voltage that is higher than the above-mentioned second voltage, a memory cell array wherein the memory cells are arranged at intersection points of word lines and bit line pairs, and which hold charges corresponding to the above-mentioned first voltage and the above-mentioned second voltage as data, a sense amplifier block that is connected to the above-mentioned bit line pairs, and contains a sense amplifier that operates in response to the above-mentioned first voltage and the above-mentioned third voltage during the first period of reading the data that is stored in the above-mentioned memory cells, and which operates in response to the above-mentioned first voltage and the above-mentioned second voltage during a second period, a first, second, and third wiring for the purpose of respectively supplying the above-mentioned first voltage, the above-mentioned second voltage, and the above-mentioned third voltage to the above-mentioned sense amplifier block, and a sense amplifier drive control means that controls the length of the above-mentioned first and second periods in response to the length of the wiring between the above-mentioned wiring for the above-mentioned voltage supplying nodes and the above-mentioned sense amplifier block.

Also, optimally, the above-mentioned sense amplifier drive control means controls the length of the above-mentioned first period according to the length of the above-mentioned wiring.

Also, the above-mentioned sense amplifier drive control means contains a pulse signal generating circuit that generates a drive pulse signal of a pulse width corresponding to the above-mentioned line length, and the above-mentioned drive pulse signal controls the length of the above-mentioned first period.

Also, optimally, the above-mentioned pulse signal generating circuit contains a delay circuit that applies a prescribed delay time to the reference pulse signal and a logic calculating circuit that generates the above-mentioned drive pulse signal by inputting the above-mentioned reference pulse signal and the output signal of the above-mentioned delay circuit.

Lastly, the delay time for the above-mentioned delay signal is set to a time corresponding to the above-mentioned wiring length.

According to this invention, the supply time for the three voltages to the sense amplifiers, in other words, the time for the overdrive, is controlled in response to the wiring length between the sense amplifier block (sense amplifier bank) and the voltage supply node, and since the supply time for the voltage used for the overdrive for the sense amplifier is adjusted to long corresponding to a long wiring length between the voltage supplying node used for the overdrive and the sense amplifier block, the effect of the sensing delay for the sense amplifier due to the voltage drop that is generated in the power supply line is compensated for.

Also, since the time for the overdrive at the sense amplifier can be a optimally set corresponding to the wiring length between the sense amplifier block and the voltage supply node, a surplus overdrive can be prevented, and a change to a low power consumption for the semiconductor memory device can be accomplished.

Also, since the time for the overdrive at the sense amplifier is adjusted by means of the pulse width of the drive pulse signal that the pulse signal generator circuit of the sense amplifier drive control means generates, and that pulse width can be adjusted according to the delay time of the delay circuit to which the reference pulse signal is applied, the time for the overdrive for the sense amplifier can be conveniently set by means of a simple circuit construction.

REFERENCE NUMERALS AND SYMBOLS AS SHOWN IN THE DRAWINGS

Figure 10:
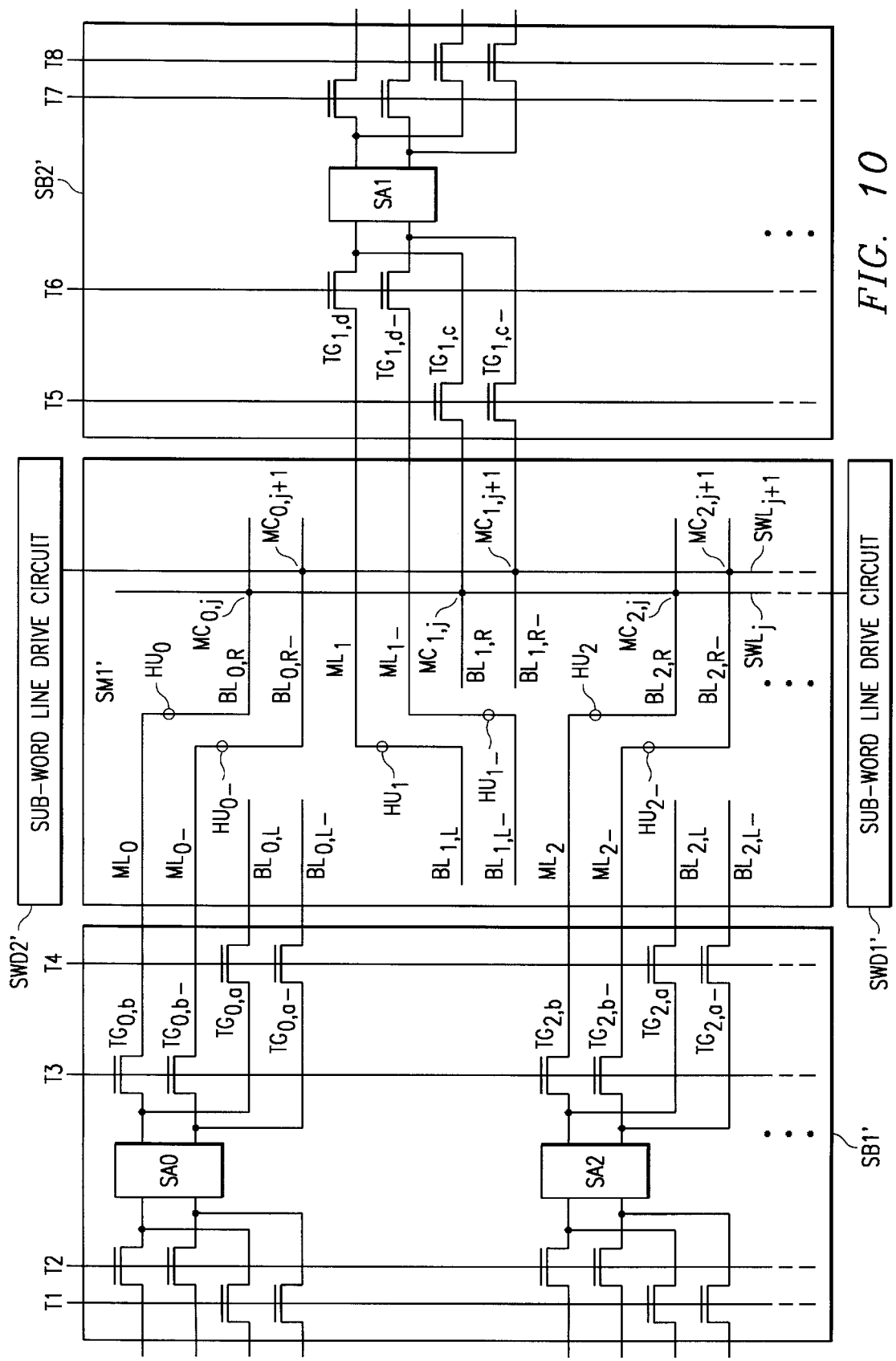
FIG. 10 is a block diagram showing an outline of the construction of submatrixrix SM1', in which the tiered bit line construction is used.
Figure 12:
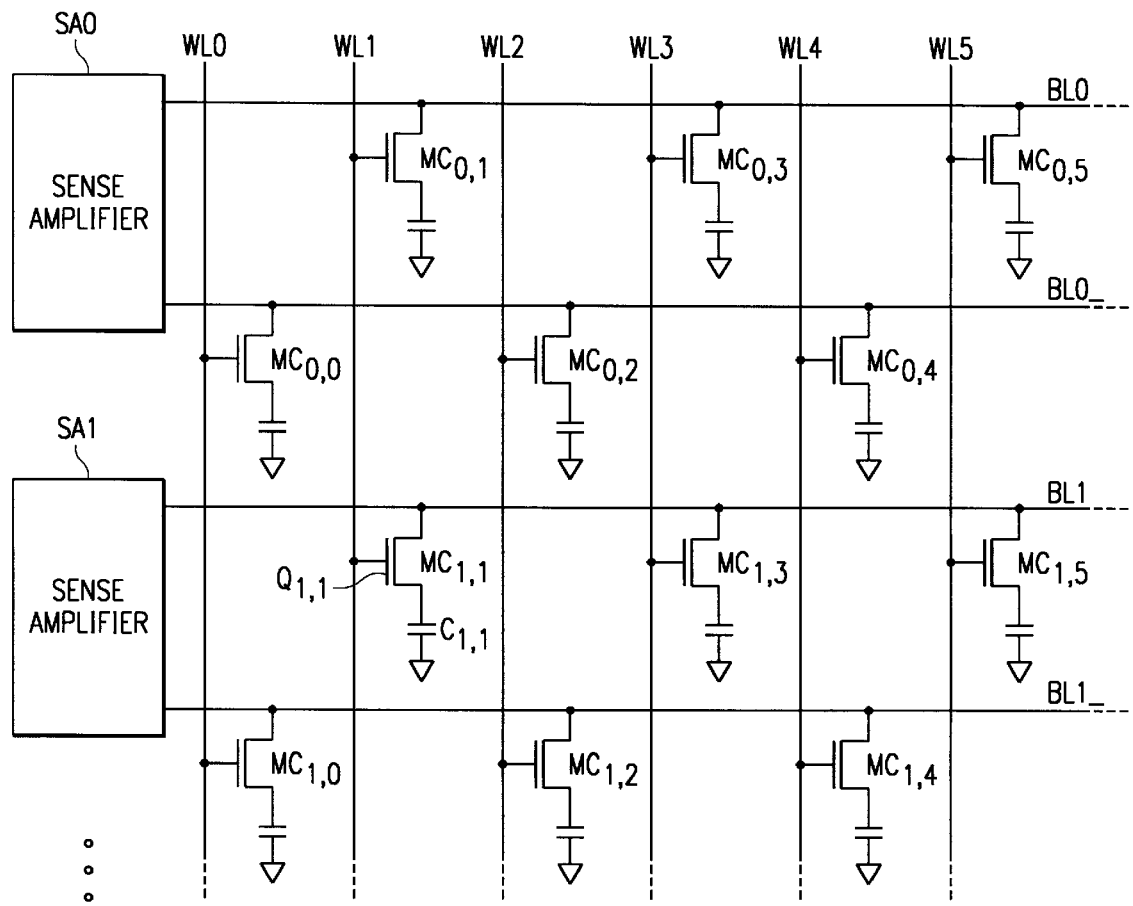
FIG. 12 is a circuit diagram showing a construction example for a DRAM memory array.
Figure 13:
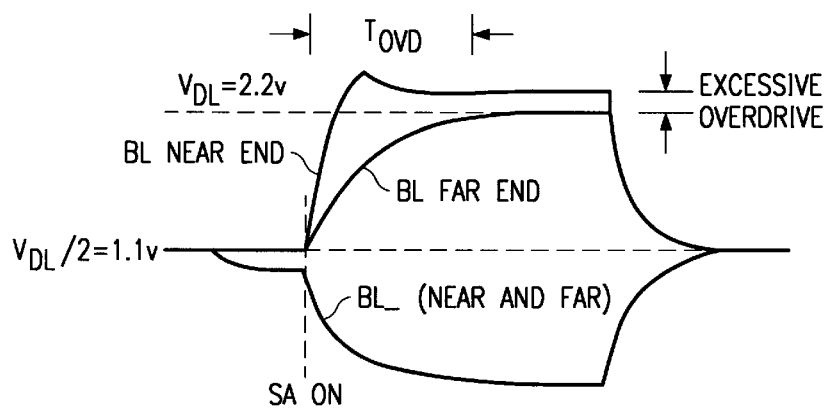
FIG. 13 is a diagram showing the changes of the bit line potential on the memory cell mat for the near end and the far end when reading is performed in an example of the prior art.

In the Figures 10, 20, 30 are power supply voltage main wiring, 40, 50, 60 are power supply voltage wiring, 70, 72 are level shift circuits, MA0 to MA7 are memory arrays, AC0 is an array control circuit, M0 to M15 are memory cell matrices, SB0 to SB16 are sense amplifier banks, SWL is a sub-word line, BL is a bit line, BL__ is a complementary bit line, MC is a memory cell, SWD1, SWD2, SWD1', SWD2', and sub-word line drive circuits, SA0, SA1, SA2, SA3 are sense amplifiers, and DLY is a delay circuit.

DESCRIPTION OF EMBODIMENTS

Figure 1:
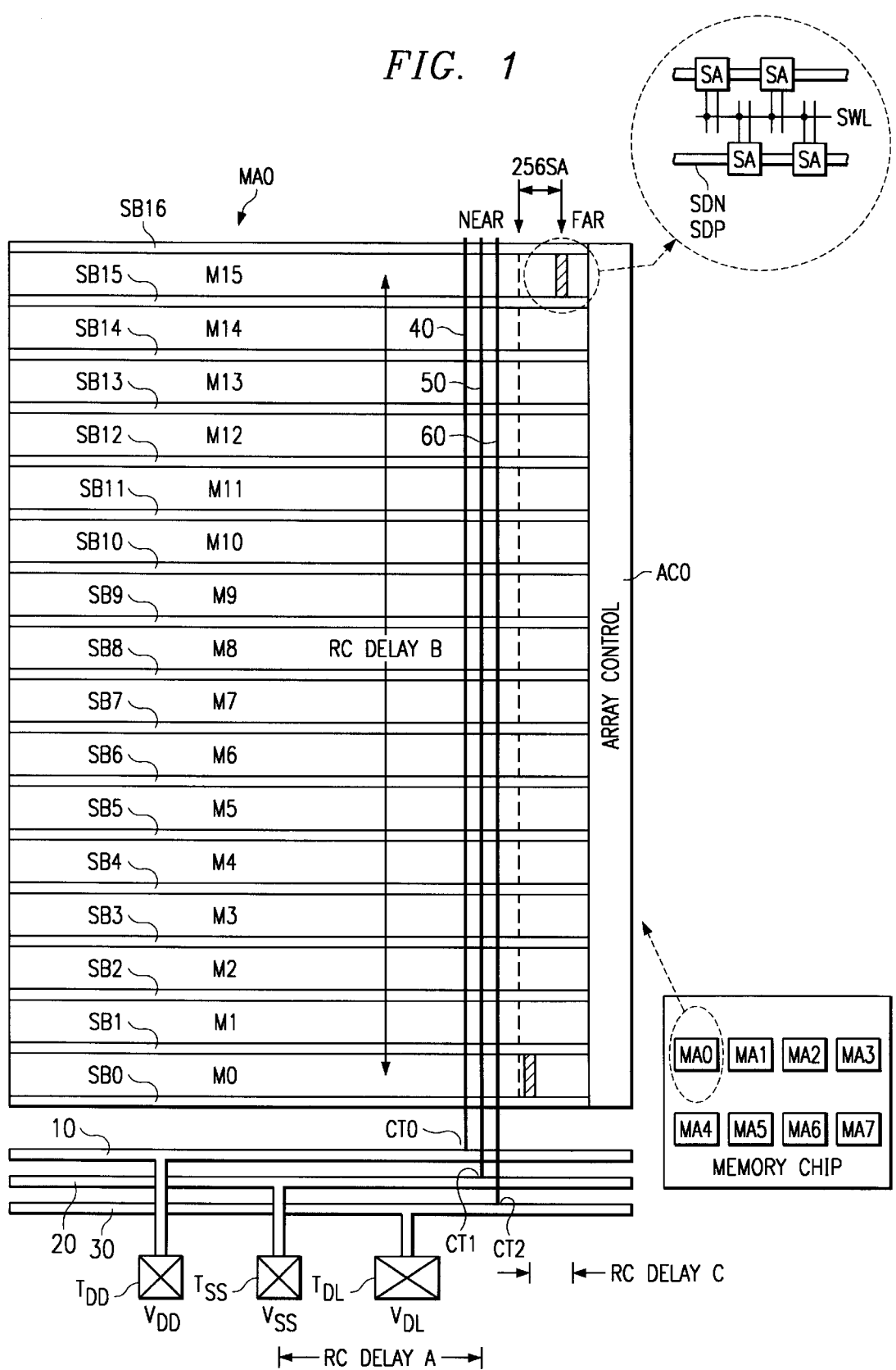
FIG. 1 is a block diagram of a semiconductor memory device related to this invention.

FIG. 1 is a block diagram of a semiconductor memory device related to this invention.

This example of a semiconductor memory device is, for example, a 64 Mb DRAM. As is illustrated, the memory chip is constructed of the eight memory arrays MA0 to MA7, and each memory array has a storage capacity of 8 Mb (megabits). FIG. 1, as an example, shows an outline of the internal construction of the memory array MA7.

The memory array MA0 is constructed by means of the array control circuits AC0, memory cell matrices M0 to M15, and sense amplifier banks SB0 to SB16, and each memory cell mat has a storage capacity of 512 Kb (kilobits).

The array control circuit AC0, for example, contains the circuit that controls the operation of the sense amplifier banks, the main word line drive circuit that selectively controls the main word line MWL, and the sub-word line drive circuit that selectively controls the sub-word lines SWL. The memory cell mat is constructed by means of, for example, the memory cells that are arranged at the intersection points of the sub-word lines and the bit line pairs. The sub-word lines are selected and activated by means of the sub-word line drive circuit SWD. The bit line pairs are connected to the respective sense amplifiers.

Figure 2:
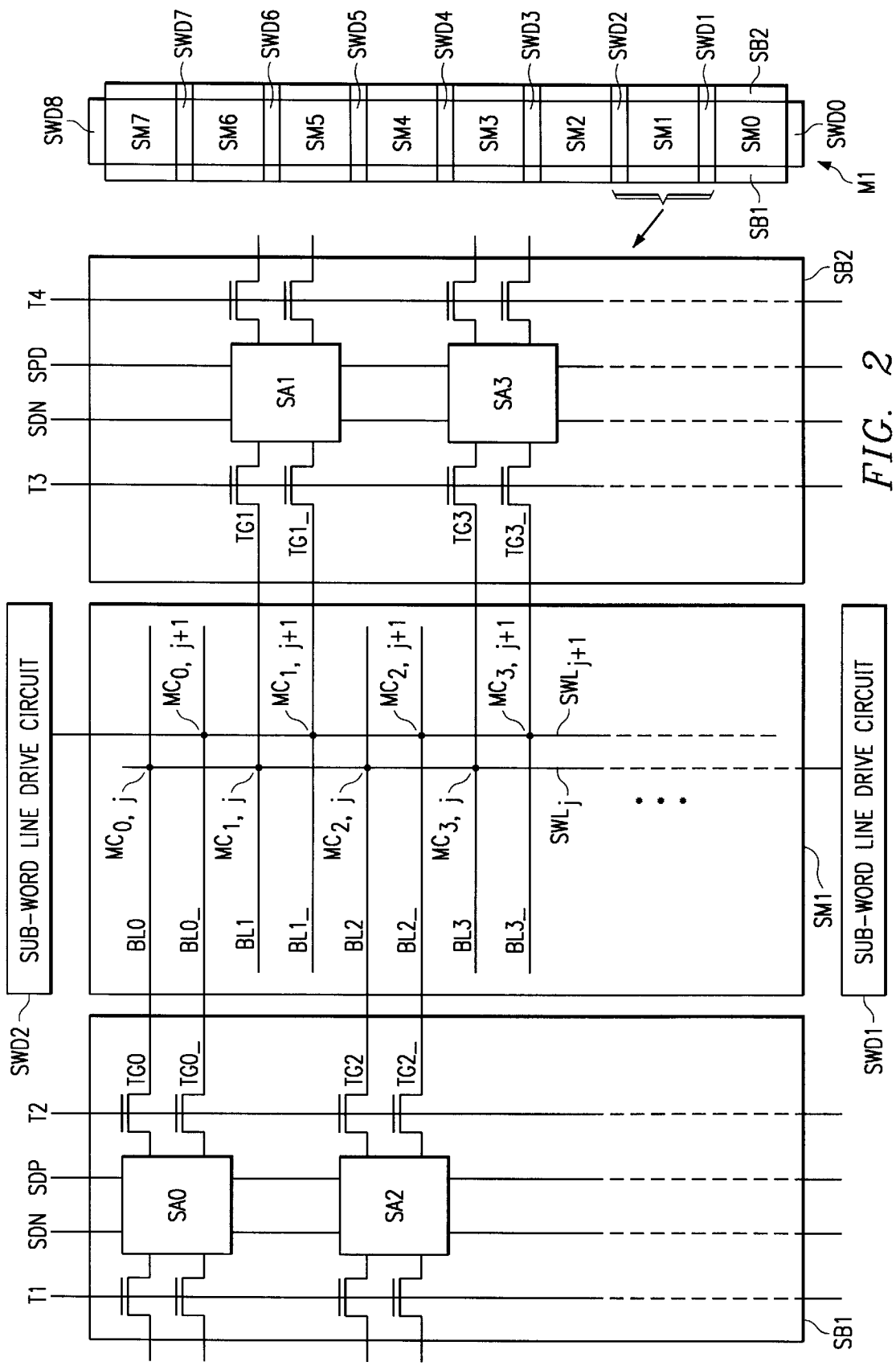
FIG. 2 is a block diagram showing an outline of the construction of the memory cell mat M1 in FIG. 1.

FIG. 2 is block diagrams showing an outline of the construction of the memory cell mat M1. The memory cell mat M1 is sandwiched between the sense amplifier bank SB1 and the sense amplifier bank SB2, and is constructed by means of the eight submatrixrices SM0 to SM7, and the nine sub-word line drive circuits SWD0 to SWD8. Also, each submatrixrix has a storage capacity of 64 Kb (kilobits).

In submatrixrix SM1, the respective 128 sub-word lines are alternately extended from the sub-word line drive circuit SWD1, SWD2, and the 256 bit line pairs are respectively alternately connected to the sense amplifiers SAi in the sense amplifier banks SB1, SB2. During memory access, in response to address information that is input to the not illustrated main word line and the sub-word line drive circuits SWD1, SWD2, one line from the 256 lines is selected and held at the high level of an activated state by means of the sub-word line drive circuits SWD1, SWD2. In FIG. 2, for explanation purposes, only the sub-word lines $SWL_j$, $SWL_{j+1}$ j=0, 1, 2, . . . , 255 are shown. The respective 128 sense amplifiers SAi are arranged in the portions of the sense amplifier banks SB1, SB2 corresponding to submatrixrix SM1. The sense amplifiers SA0, SA2, . . . , SA254 are arranged in the sense amplifier bank SB1, and the sense amplifiers SA1, SA3, ..., SA255 are arranged in the sense amplifiers bank SB2. In FIG. 2, only the sense amplifiers SA0, SA1, SA2, SA3 are shown.

As for the sense amplifier bank SB1, it is commonly used by memory cell matrices M0 (not illustrated) and M1 that are arranged on both sides of it, and in the same manner, the sense amplifier bank SB2 is jointly used by the memory cell matrices M1, M2 (not illustrated).

Below, an explanation is given in regard to the construction of submatrixrix SM1.

In submatrixrix SM1, one memory cell is arranged at the intersection point of the sub-word line and the bit line and the complementary bit line. Using FIG. 2 as an illustration, only the memory cells $MC_{0,j}$, $MC_{0,j+1}$, $MC_{1,j}$, $MC_{1,j+1}$, $MC_{2,j}$, $MC_{2,j+1}$, $MC_{3,j}$, $MC_{3,j+1}$ are shown. Also, in FIG. 2, the arrangement position of the memory cell is shown by means of the dots for the intersection points of the sub-word line and the bit lines and complementary bit lines, and the construction of the memory cell is omitted. The memory cell is constructed by means of, for example, a single transistor Q and a single capacitor C.

The sense amplifier is connected to the bit line pair by means of the transistor gate. For example, the sense amplifier SA0 is connected to the bit line pair BL0, BL0__ by means of the transfer gates TG0, TG0__. The gates of the transfer gates TG0, TG0__ are connected to the control signal line T2. When this control signal line T2 is held at a high level, the transfer gates TG0, TG0__ are in the ON state, are connected to the sense amplifier SA0 and the bit line pair BL0, BL0__, and enable writing or reading of the memory cell.

It is also the same at the other sense amplifiers. In FIG. 2, the transfer gates and the sense amplifiers are separately arranged, but in an actual circuit, the transfer gates can be arranged in the sense amplifier. Also, it is not illustrated, however, the control signal lines T1 to T4 that control the ON/OFF state of the transfer gates, for example, are connected to the array control circuit AC0 shown in FIG. 1, and are controlled by means of the X decoder in the array control circuit AC0.

As is shown in FIG. 1, the power supply voltage $V_{DD}$, the common potential $V_{SS}$, and the memory array internal power supply voltage $V_{DL}$ are respectively supplied to each sense amplifier bank SB0 to SB16. The power supply voltage $V_{DD}$ and the common potential $V_{SS}$ are input by means of the terminals $T_{DD}$, $T_{SS}$, respectively, and the internal power supply voltage $V_{DL}$, for example, is generated by means of the voltage dropping circuit that is provided on the memory chip, and is input from the terminal $T_{DL}$. In this example, the power supply voltage $V_{DD}$ is made 3.3 V, the common potential $V_{SS}$ 0 V, and the internal power supply voltage $V_{DL}$ 2.2 V.

The power supply voltage $V_{DD}$, the common potential $V_{SS}$ and the internal power supply voltage $V_{DL}$ are sent to the vicinity of each memory array MA0 to MA7 by means of the main wiring 10, 20, 30 on the memory chip, respectively, and are further supplied to each sense amplifier bank SB0 to SB16 in each memory array by means of wiring 40, 50, 60. As is shown in FIG. 1, the connection location (contact) for wiring 10 and wiring 40 is CT0, the connection location (contact) for wiring 20 and wiring 50 is CT1, and the connection location (contact) for wiring 30 and wiring 60 is CT2. A voltage drop and a signal delay are generated on the wiring due to the resistance and parasitic capacitance of the wiring 10 to 60.

The delay that is generated between the supply terminals $T_{DD}$, $T_{SS}$, $T_{DL}$ for each power supply and the respective contacts CT0, CT1, CT2 is delay A, the delay that is generated between each contact CT0, CT1, CT2 and the sense amplifier banks is delay B, and the delay that is generated within each sense amplifier bank is delay C.

As for the wiring 10, 20, 30 arranged in the vicinity of the memory arrays MA0 to MA7, because a sufficient wiring space can be maintained, thick wiring can be used, and the delay A that is created on the wiring can be made small. In an actual DRAM chip, among the above-mentioned delays A, B, C, the one that is the largest is delay B, in other words, the delay that is generated in the wiring 40, 50, and 60 from the contacts to each sense amplifier bank. This is because the use of somewhat thick wiring for wiring 40, 50, and 60 is very difficult due to limitations on the layout. The delay B changes in response to the wiring length between the contacts CT0, CT1, CT2 and the sense amplifier banks. For example, in the memory array MA0 shown in FIG. 1, since the wiring to the sense amplifier bank SB0 is the shortest, and the wiring to the sense amplifier bank SB16 is the longest, the delay B that is generated on the wiring to the sense amplifier bank SB0 is the smallest, and the delay B that is generated on the wiring to the sense amplifier bank SB16 is the largest. Also, not only is there a delay, but because a voltage drop is generated due to the resistance of the wiring, the power supply voltage that is supplied to the sense amplifier bank SB0 becomes the largest, and the power supply voltage that is supplied to the sense amplifier bank SB16 becomes the smallest. Because of this, in the case of supplying a power supply voltage of the same pulse width to each sense amplifier SB0 to SB16, for example, the power supply voltage $V_{DD}$ used for overdrive, in order to ensure writing and reading operations for the sense amplifier bank SB16 at the far end, if the pulse width is set according to that, a surplus overdrive is generated at the sense amplifier bank SB0 at the near end.

In this invention, the pulse width used for the overdrive for each sense amplifier bank is controlled in response to the arrangement positions of the sense amplifier, for example, by means of setting the pulse width used for the overdrive for the sense amplifier bank SB0 of the near end small, and setting the pulse width used for the overdrive of the sense amplifier bank SB16 of the far end large, at the same time ensuring the writing reading operations for the far end, a surplus overdrive at the near end can be avoided.

Figure 3A:
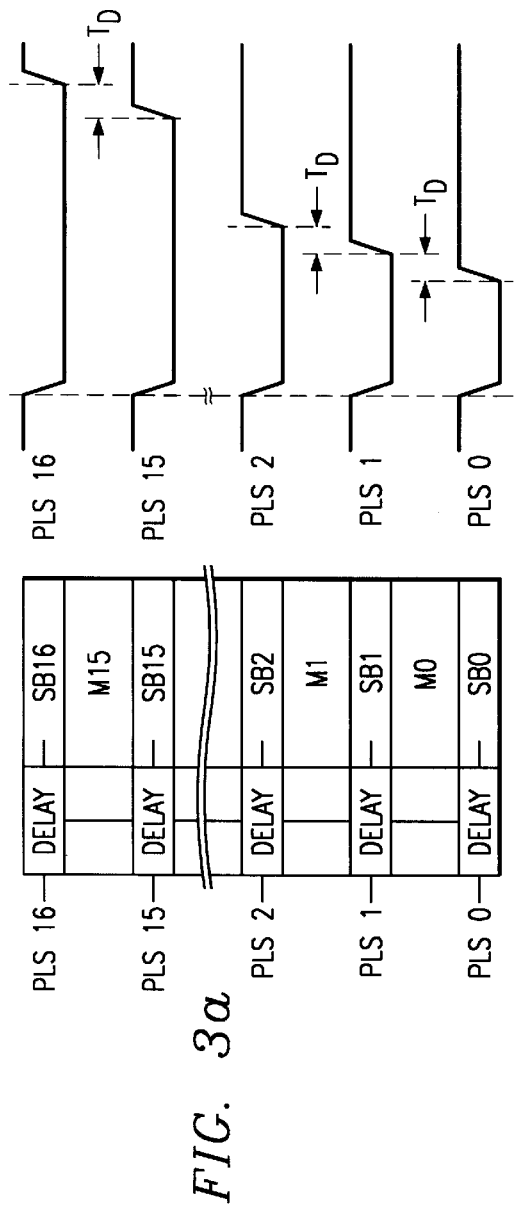
FIG. 3 is diagrams showing one example of the pulse generating circuit used for overdrive and the waveforms for the pulse used for overdrive.

FIG. 3 shows one example of a pulse generating circuit used for overdrive. This is schematically shown for the memory array MA0 shown in FIG. 1, and the memory array is constructed by means of the 16 memory cell matrices M0 to M15 and the 17 sense gamplifier banks SB0 to SB16. The pulse signals PLS0 to PLS16 used for the overdrive shown in FIG. 3a are respectively input to each sense amplifier bank SB0 to SB16.

Figure 3B:
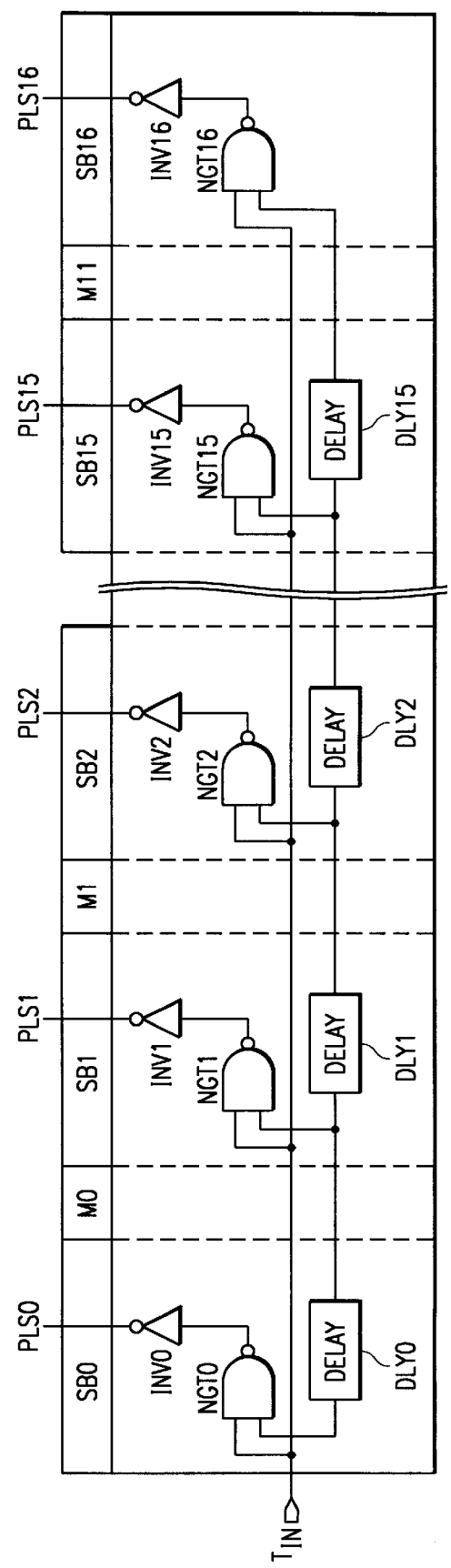

FIG. 3b shows a schematic for the pulse generating circuit used for the overdrive. This generating circuit is provided, for example, in the array control circuit AC0 shown in FIG. 1. As is illustrated, the pulse generating circuit is constructed by means of the delay circuits DLY0 to DLY15, NAND gates NGT0 to NGT16, and inverters INV0 to INV16.

One of the terminals of the NAND gates NGT0 to NGT16 is connected to the input terminal $T_{IN}$ for the overdrive control signal SA0, and the other input terminal is connected to the output terminal of the delay circuits DLY0 to DLY15. For example, one of the input terminals of the NAND gate NGT1 is connected to the input terminal $T_{IN}$, and the other input terminal is connected to the output terminal of the delay circuit DLY0. Also, one of the input terminals of the NAND gate NGT16 is connected to the input terminal $T_{IN}$, and the other input terminal connected to the output terminal of the delay circuit DLY15. Both of the input terminals of the NAND gate NGT0 are connected to the input terminal $T_{IN}$, also, the input terminal of the delay circuit DLY0 is also connected to the input terminal $T_{IN}$, and each of the delay circuits DLY0 to DLY15 are connected in series. The output terminals of the NAND gates NGT0 to NGT16 are connected to the inverters INV0 to INV16, respectively, and the pulse signals PLS0 to PLS16 used for overdrive are output from the output terminals of the inverters INV0 to INV16.

The overdrive control signals SAO that are input to the input terminal $T_{IN}$ are low active signals, for example, are signals that are held at a low level for an interval of 14 to 17 nsec. Because of that, the pulse PLS0 used for overdrive that is applied to the sense amplifier bank SB0, as is shown in FIG. 3a, is a negative pulse signal that is held at a low level for an interval of 14 to 17 nsec. Here, an input signal for the same delay time $T_D$ is applied to the delay circuits DLY0 to DLY15. By this means, the pulses PLS1 to PLS16 used for overdrive that are supplied to the sense amplifier banks SB1 to SB16 are pulses in which the width becomes respectively longer than the pulse PLS0 used for overdrive by time $T_D$.

Figure 4:
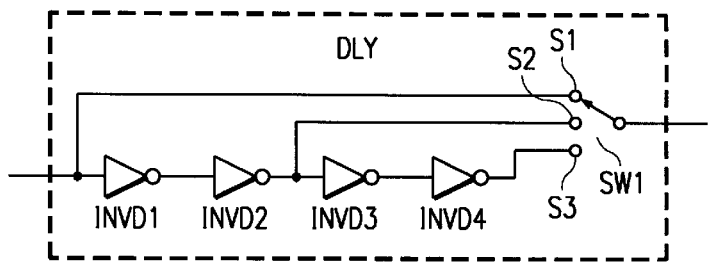
FIG. 4 is a diagram showing one example of a delay circuit DLY of FIG. 3.

The delay time $T_D$ for the delay circuits DLY0 to DLY16 is variable, and an extremely fine adjustment is possible in response to the actual operating mode. FIG. 4 shows one example of the delay circuit DLY. The delay circuit DLY is constructed by means of four inverters INVD1, INVD2, INVD3, INVD4, and switch SW1. The inverters INVD1 to INVD4 are connected in series. Switch SW1 selects and outputs one of the three signals from terminals S1, S2, S3. Terminal S1 is connected to the input terminal of delay circuit DLY, terminal S2 is connected to output terminal of the inverter INVD2, and terminal S3 is connected to the output terminal of inverter INVD4.

Because of this, when terminal S1 is selected by means of switch SW1, the delay time $T_D$ of the delay circuit DLY is approximately 0. When terminal S2 is selected, the delay time $T_D$ of the delay circuit DLY is generated by two inverters, and when terminal S3 is selected, time $T_D$ generated by four inverters. If it is assumed that the delay time of two inverters is, for example, 0.4 nsec, the delay time $T_D$ of delay circuit DLY can be set to any of 0, 0.4, and 0.8 nsec.

Figure 5A:
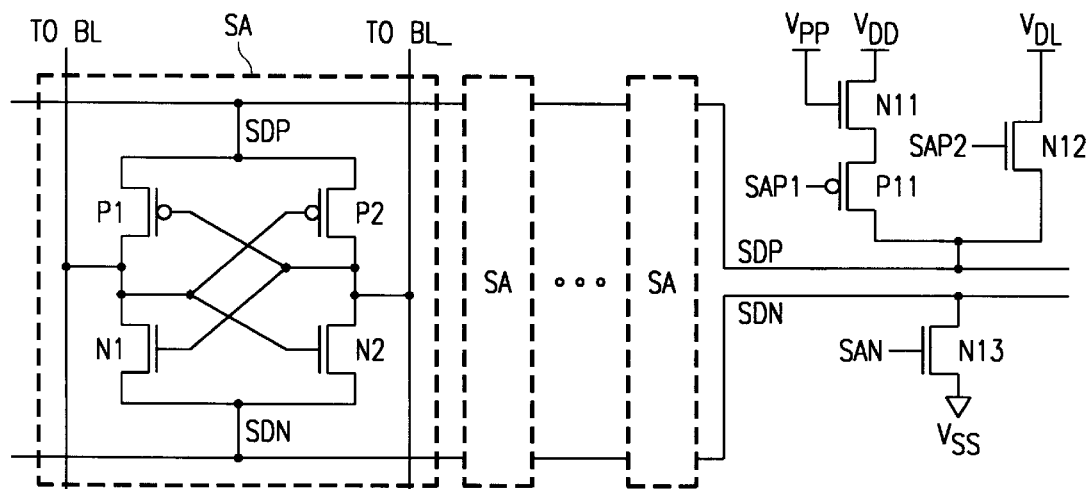
FIG. 5 is diagrams showing an overdrive circuit for the sense amplifier and the waveform of the sense amplifier control signal.

FIG. 5 shows the overdrive circuit for the sense amplifier and the waveforms for the sense amplifier control signal. Each sense amplifier SA that is arranged in the sense amplifier banks is constructed from two P channel MOS transistors P1, P2 and two N channel MOS transistors N1, N2. The transistors P1, N1 are connected in series between the power supply lines SDP, SDN, and their gates are connected to the complementary bit line BL_. Also, the transistors P2, N2 are connected in series between the power supply lines SDP, SDN, and their gates are connected to the bit line BL. The power supply line SDP is connected to the internal power supply voltage $V_{DL}$ by means of N channel MOS transistor N12, and is also connected to the power supply voltage $V_{DD}$ by means of P channel MOS transistor P11 and the N channel MOS transistor N11. The power supply line SDN is connected to the common potential $V_{SS}$ by means of N channel MOS transistor N13. These transistors N11, N12, N13, P11 construct the overdrive circuit.

Figure 5B:
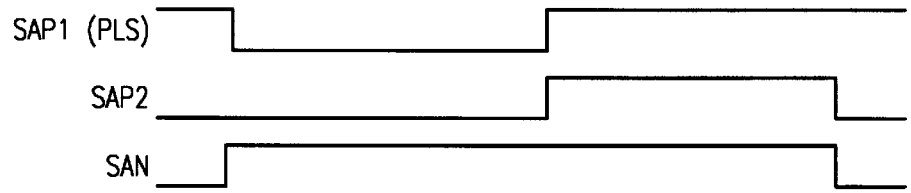

The power supply lines SDP, SDN are usually precharged to $V_{DL}/2$, but if the sense amplifier SA is activated, power supply line SDP is changed to the $V_{DD}$ level for the $V_{DL}$ level, and power supply line SDN to the $V_{SS}$ level, respectively. As is shown in FIG. 5b, the control signal SAP1 becomes a low in response to the activation of the sense amplifier, and the control signal SAN becomes high. This control signal SAP1 corresponds to the overdrive pulse signals PLS0 to PLS16 that are generated by the overdrive pulse generating circuit, the power supply line SDP is connected to the power supply voltage $V_{DD}$, and the overdrive operation is conducted. When the control signal SAP1 pulse signal PLS becomes high, the overdrive operation is ended, at that time the control signal SAP2 becomes a high level, and the power supply line SDP is connected to the internal power supply voltage $V_{DL}$. After that, the control signals SAP2 and SAN become low, and the reading operations for the sense amplifier SA is completed.

Figure 6:
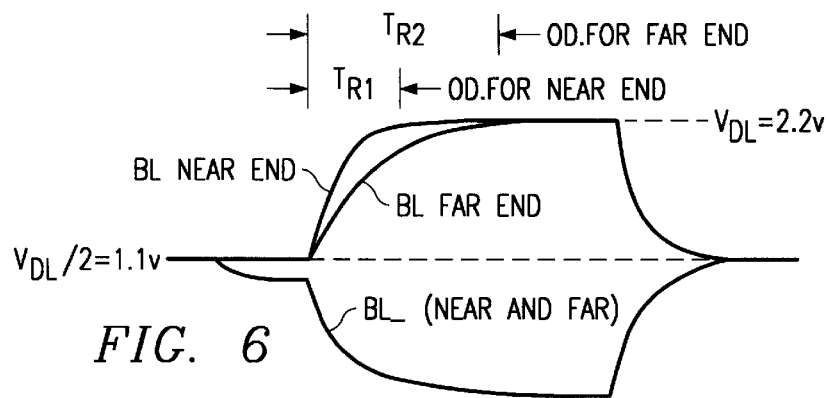
FIG. 6 is a diagram showing the potential change of the bit lines during reading in the case of conducting overdrive control according to this invention.

FIG. 6 shows the changes in potential for the bit line during reading in the case of conducting the overdrive control by means of this invention.

As in the figure, the width of the overdrive pulse PLS that is applied to the sense amplifier bank of the near end is TR1, and the width of the overdrive pulse that is applied to the sense amplifier bank of the far end is TR2, and the far end pulse width TR2 is set wide compared to the near end pulse width TR1.

Before access, both the bit line BL and the complementary bit line BL__ are precharged to an intermediate potential, for example, the $V_{DL}/2$ potential. When reading is begun, initially, by means of the sense amplifier, a voltage that is higher than the internal power supply voltage $V_{DL}$ is applied to the bit line, for example, the voltage of the power supply voltage $V_{DD}$ level, and the voltage of the common potential $V_{SS}$ level is applied to the complementary bit line BL__. At this time, since the bit line BL is placed in overdrive by means of the power supply voltage $V_{DD}$ level, the potential rise of the bit line BL is fast. When the time for the overdrive pulse has elapsed, the voltage of the internal power supply voltage $V_{DL}$ level is applied to the bit line BL.

The pulse width used for overdrive is set according to the arrangement position of the sense amplifier bank, in other words, to the distance from the main wiring wiring 10, 20, 30, and since the pulse used for the near end is set narrow and the pulse width is set wider the closer it is to the far end, the sensing delay in the sense amplifier bank at the far end due to the voltage drop on the power supply line is compensated for, and also, an excess overdrive at the sense amplifiers for the near end is avoided. As is shown in FIG. 6, as a result of the overdrive, the bit lines that are connected to the sense amplifiers of the sense amplifier banks of both the near end and far end are precharged to the internal voltage supply power supply voltage $V_{DL}$, and insufficient overdrive at the far end and excess overdrive at the near end is suppressed.

Figure 7:
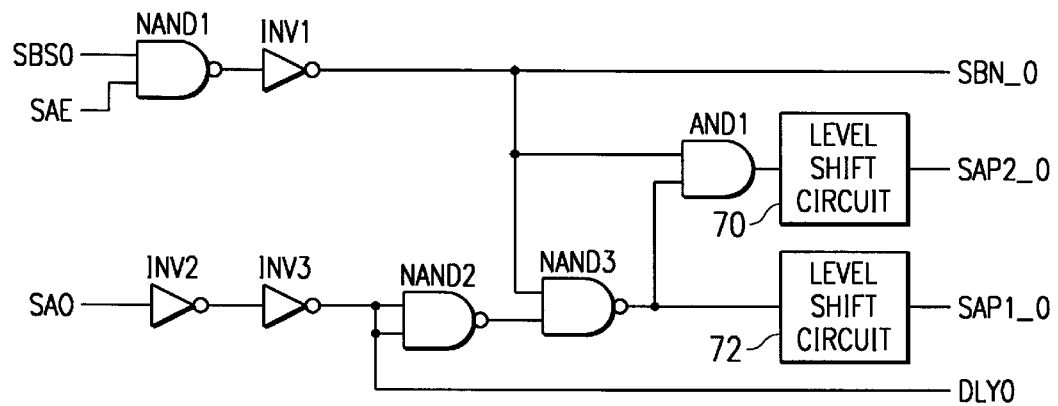
FIG. 7 is a circuit diagram for the first stage overdrive timing control signal generating circuit.
Figure 8:
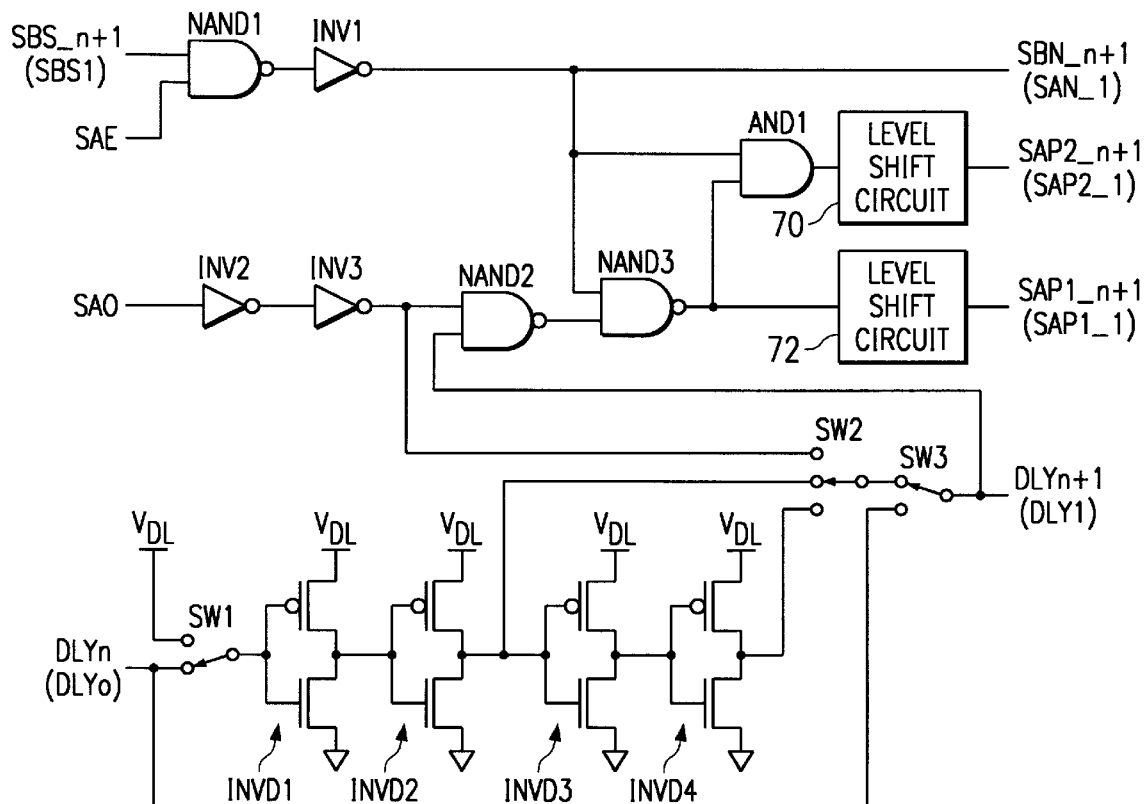
FIG. 8 is a circuit diagram of the second stage and after overdrive timing control signal generating circuit.
Figure 9:
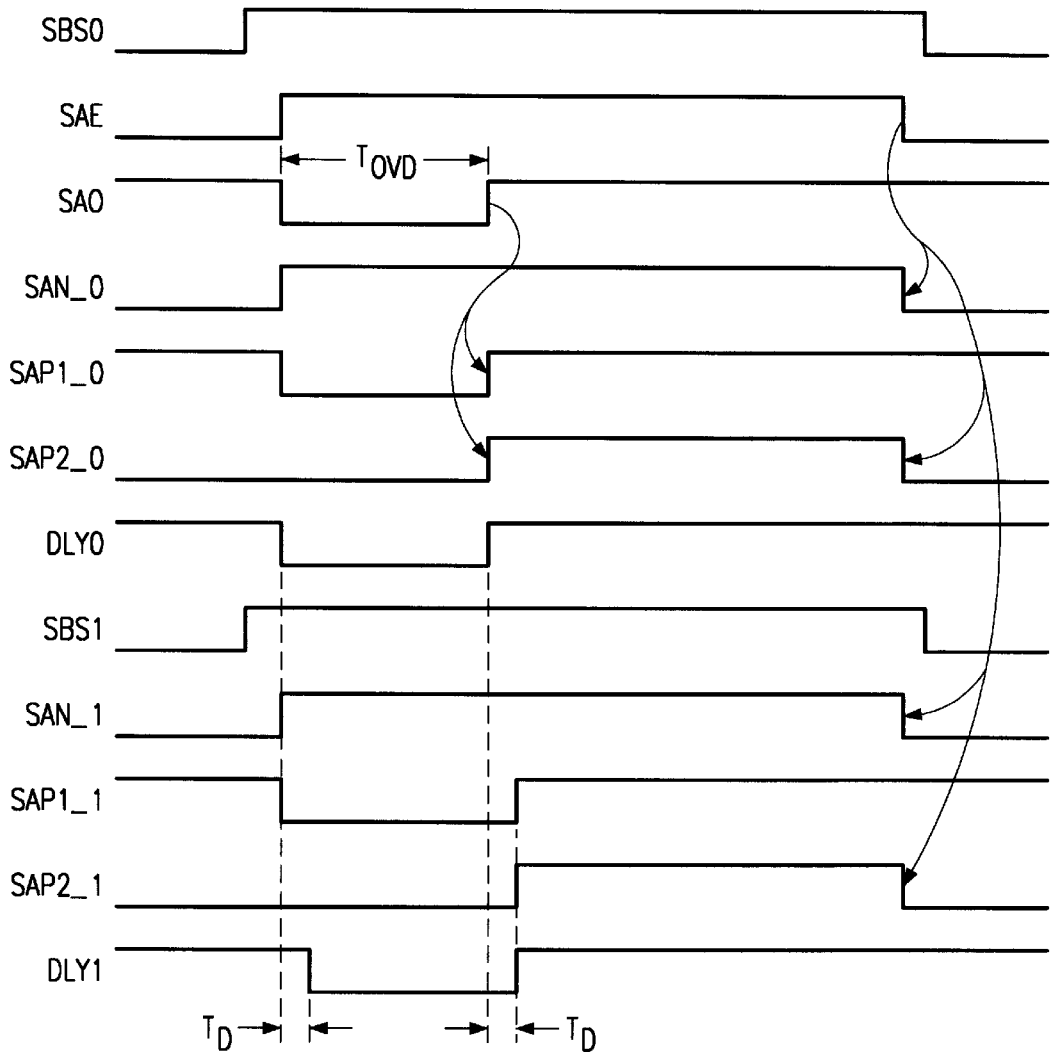
FIG. 9 is a waveform chart for the purpose of explaining the operation of the overdrive timing control signal generating circuits shown in FIG. 7 and FIG. 8.

FIG. 7 and FIG. 8 are detailed schematrixics of the generating circuits for the overdrive timing control signals, and FIG. 9 is a waveform diagram for explaining their operations.

FIG. 7 is a schematic of the circuit (hereinafter, called the first stage generating circuit) that supplies (generates) an overdrive signal to the sense amplifier bank that is arranged closest to the main wiring, and FIG. 8 is the circuit diagram for the generating circuit for the overdrive signal that is connected next to the initial 2nd stage. The overdrive signal generating circuit for each stage after the second stage is basically the same construction, and below, the second overdrive signal generating circuit used for the second stage is explained in the example, and detailed explanations are omitted in regard to the generating circuits for each stage after that. Here, it is assumed that the initial stage corresponds to the sense amplifier bank SB0 of FIG. 1, and the second stage corresponds to the sense amplifier bank SB1 of FIG. 1.

As is shown in FIG. 7, the overdrive signal generating circuits for the initial stage is constructed by means of the NAND gates NAND1, NAND2, NAND3, AND gate AND1, inverters INV1, INV2, INV3, and the level shift circuits 70, 72.

The sense amplifier bank SB0 selection signal SBS0 and the sense amplifier enable signal SAE are supplied to the two input terminals of the NAND gate NAND1, and its output terminals are connected to the input terminal of the inverter INV1. Also, the overdrive control signal SAO is applied to the input terminal of the inverter INV2, and its output is connected to the input terminal of the inverters INV3. The output signal of the inverter INV3, along with being supplied to the two input terminals of the NAND gate NAND2, is supplied to the next stage overdrive signal generating circuit as the delay signal DLY0 of the first stage.

The output signal of the inverter INV1, along with being supplied to the sense amplifier bank SB0 as the control signal SAN__, is supplied to one of the input terminals of the AND gate AND1 and the NAND gate NAND3. The output signal of the NAND gate NAND2 is supplied to the other input terminal of the NAND gate NAND3, and the output signal of the NAND gate NAND3 is supplied to the other input terminal of the AND gate AND1 and the level shift circuit 72. The level shift circuit 72 changes the input signal of the voltage level $V_{SS}$ (0 V) $-V_{DL}$ (2.2 V) to the signal of the voltage level $V_{SS}$ (0 V) $-V_{DD}$ (3.3 V) and supplies it to the sense amplifier bank SB0. The output signal of the AND gate AND1 is supplied to the level shift circuit 70, and the level shift circuit 70 changes the input signal of the voltage level $V_{SS}-V_{DL}$ to a signal of the voltage level $V_{SS}-V_{DD}$, and supplies it to the sense amplifier bank SB0.

The signals SAN__0, SAP1__0, and SAP2__0 in FIG. 7 are respectively supplied to the transistor gate N13, the transistor gate P11, and the transistor gate N12 of the overdrive circuit shown in FIG. 5.

The second overdrive signal generating circuit, as is shown in FIG. 8, is constructed by means of the NAND gates NAND1, NAND2, NAND3, the AND gate AND1, the inverters INV1, INV2, INV3, level shift circuits 70, 72, and the delay circuit DLY. The delay circuit DLY is constructed from the switch SW1 that receives the delayed signal DLY0 from the previous stage, the switch SW2 that selects one of the output signals of the series connected inverters INVD1, INVD2, INVD3, INVD4, inverter INV3, inverter INVD2, or inverter INVD4, and the switch SW3 that selects either the output signal of the switch SW2 or the previous stage delay signal DLY0. In the example of FIG. 8, the switches SW1, SW2, and SW3 are set so as to select the previous stage delay signal DLY0, the output signal of the inverter INVD2, and the output signal of the switch SW2, respectively.

In FIG. 7 and FIG. 8, the sense amplifier bank selection signals SBS0, SB1 are activated in response to the address signals that are supplied from an external section of the DRAM, for example, in the case of the DRAM of the construction shown in FIG. 1, one among the 17 sense amplifier banks SB0 to SB16 is selected. Also, the sense amplifier enable signal SAE is also activated in response to an address signal that is supplied from an external portion of the DRAM, and the sense amplifiers in the sense amplifier bank are activated by means of the sense amplifier bank selection signal and the sense amplifier enable signal.

Below, an explanation is given in regard to the operation of the overdrive signal generating circuit while referencing the waveform diagram of FIG. 9.

In FIG. 9, when the sense amplifier bank SB0 is selected in response to an address signal that is supplied from an external section of the DRAM, the sense amplifier bank selection signal SBS0 is activated to high. Next, the sense amplifier enable signal SAE is activated to a high-level. Simultaneous with this activation of this sense amplifier enable signal SAE, the overdrive control signal SAO that is generated by a not-illustrated signal is activated to low, and this overdrive control signal SAO is held at low during the period of $T_{OVD}$. In response to this sense amplifier enable signal SAE and overdrive control signal SAO, the control signals SAN_0 and SAP1_0, which control the transistor N13 and the transistor P11 of the overdrive circuit shown in FIG. 5 in a conductive state, are respectively activated. Therefore, the power supply line SDN is placed at $V_{SS}$ 0 V, and the power supply line SDP is overdriven to the $V_{DD}$ 3.3 V level.

When the overdrive control signal SAO is changed to high, the control signal SAP1_0 is changed to high correspondingly, and the control signal SAP2_0 is activated to high. Therefore, the transistor P11 in FIG. 5 is shifted to the OFF state, and the transistor N11 is shifted to the ON state. The overdrive of the power supply line SDP is removed by means of the operation of this series of transistors P11, N11, and the power supply line STP is made $V_{DL}$ 2.2 V. In this manner, the time for the overdrive in the overdrive signal generating circuit is made the same as the set time $T_{OVD}$ of the overdrive control signal SA0. After that, when the sense amplifier enable signal is changed to low, the control signals SAN_0, SAP2_0 are changed to low, the transistors N12, N13 of FIG. 5 are shifted to the OFF state, and the power supply lines SDP, SDN are precharged to the $V_{DL}/2$ level by means of a not-illustrated precharge circuit.

In FIG. 9, when the sense amplifier bank SB1 is selected in response to the address signal that is supplied from an external section of the DRAM, the sense amplifier bank selection signal SBS1 is activated to high. Next, the sense amplifier enable signal SAE and the overdrive control signal SAO are activated to the low level, and this overdrive control signal SAO is held low during the period of $T_{OVD}$. The control signals SAN_1 and SAP1_1 that control the conductive states of the transistor N13 and the transistor P11, respectively, in the overdrive circuit shown in FIG. 5, are activated. Therefore, the power supply line SDN is made $V_{SS}$ 0 V, and the power supply line SDP is overdriven to the $V_{DD}$ 3.3 V level.

The delay signal DLY0 that is output from the signal generating circuit used for the overdrive of the initial stage shown in FIG. 7 is input to the delay circuit DLY of the signal generating circuit used for the second overdrive shown in FIG. 8, the delay $T_D$ for two inverter stages INVD1, INVD2 are provided, and are supplied to the signal generating circuit used for the overdrive of the next stage and to the NAND gate NAND2. Even though the overdrive control signal SAO is changed to high, since the other input signal for the NAND gate NAND2, in other words, the delay signal DLY1, is held low during $T_D$, at the point in time at which the overdrive control signal SAO is changed to high and the time $T_D$ has elapsed, the control signal SAP1_1 is changed to high, and the control signal SAP2_1 is activated at the highlevel. Therefore, the transistor P11 in FIG. 5 is shifted to the OFF state, and the transistor N11 is shifted to the ON state. Due to the operation of this series of transistors P11, N11, the overdrive for the power supply line SDP is removed, and the power supply line SDP is made $V_{DL}$ 2.2 V. In this manner, the time for the overdrive at the signal generating circuit used for the second stage overdrive is made the time in which the delay time $T_D$ of the delay circuit DLY is applied to the set time $T_{OVD}$ for the overdrive control signal SA0. After that, when the sense amplifier enable signal SAE is changed to low, the control signals SAN_1, SAP2_1 are changed to low, the transistors N12, N13 of FIG. 5 are shifted to the OFF state, and the power supply line SDP, SDN are precharged to the $V_{DL}/2$ level by means of a not-illustrated precharge circuit.

The second sense amplifier overdrive signal SAP1_1 becomes a pulse signal having a width that is wider by just the delay time amount that was generated by means of the delay circuit DLY, compared to the first stage drive signal SAP1_0. Here, if it is assumed that the width of the first stage sense amplifier drive signal SAP1_0 is $T_{ODO}$, and the delay time that was generated at the delay circuit DLY 81 is $T_D$, The pulse width of the sense amplifier drive signal SAP1_1 for the second stage becomes $T_{ODO+TD}$. The pulse width $T_{ODO}$ of the sense amplifier drive signal SAP1_0 for the first stage is determined by means of the pulse width $T_{OVD}$ of the overdrive control signal SA0, and is almost the same as $T_{OVD}$.

Signal generating circuits used for overdrive having the same type of construction as the signal generating circuit used for the overdrive of the second stage are connected in multiple stages, and signal generating circuits used for the overdrive are provided in exactly the number of sense amplifier banks, including the signal generating circuit used for overdrive of the first stage. The signals used for overdrive are generated from a pulse width corresponding to each memory cell mat by means of these overdrive signal generating circuits. In the above-mentioned application example, the first stage overdrive time $T_{ODO}$ is 14 to 17 nsec, and the delay times for the delay circuits can be set to 0, 0.4, and 0.8 nsec. Since the drive timing for the sense amplifiers of the memory cell mat of the nearest end is controlled by means of the signal generating circuit used for the overdrive of the first stage, and the drive timing for the sense amplifier of the memory cell mat of the farthest end is controlled by means of the signal generating circuit used for overdrive of the farthest end, the generation of an excessive overdrive of the bit line at the memory cell matrices of the near end side can be prevented, and a sufficient overdrive can be conducted for the bit lines at the memory cell matrices of the far end side.

As was explained above, according to this invention, the supply timing is controlled for the power supply voltage to each sense amplifier bank by the sense amplifier drive control means that is in the array control circuit AC0 in response to the line length between the supply nodes CT0, CT1, CT2 for the sense amplifier power supply voltages and each sense amplifier bank SB0 to SB15, and since the supply time is shortened for the overdrive to the near end sense amplifier bank SB0 and the supply time for the overdrive voltage to the sense amplifier banks as it approaches the far end are set successively longer, the sensing delay due to the voltage drop that is generated in the supply lines between the supply nodes and the sense amplifier banks can be compensated, an equalization of the overdrive to both the near and far ends can be designed, excessive overdrive to the memory cell mat at the near end can be avoided, and a reduction in the power consumption can be realized.

FIG. 10 is a block diagram showing an outline of the construction of a submatrixrix SM1' that uses a tiered bit line construction. Submatrixrix SM1' is sandwiched by the sense amplifier bank SB1' and the sense amplifier bank SB2'. In submatrixrix SM1', 256 sub-word lines are alternately extended from the sub-word line drive circuits SWD1', SWD2', respectively, and the 256 bit line pairs (and the extended bit line pairs) are alternately connected to the sense amplifier banks SB1', SB2', respectively. During memory access, one line is selected within the 512 lines, and held at high activation state by means of the sub-word line drive circuits SWD1', SWD2' in response to the address information that is input to the main word line and sub-word line drive circuits SWD1', SWD2'. In FIG. 10, for purposes of explanation, only the sub-word lines $SWL_j$, $SWL_{j+1}$ j=0, 1, 2, . . . , 511 are shown. The respective 128 sense amplifiers SAl are arranged in the sense amplifier banks SB1', SB2' of the section corresponding to submatrixrix SM1'. The sense amplifiers SA0, SA2, . . . , SA254 are arranged in the sense amplifier bank SB1', and the sense amplifiers SA1, SA3, . . . , SA255 are arranged in the sense amplifier bank SB2'. In FIG. 10, only the sense amplifiers SA0, SA1, SA2 are shown. Also, the sense amplifier banks SB1', SB' [Sic; SB2'] are shared by the submatrixrices that are arranged on both sides of them.

Below, an explanation is given in regard to the construction of submatrixrix SM1'.

In submatrixrix SM1', a single memory cell is arranged at the intersection point of the sub-word line and the bit line and the complementary bit line, and in the same manner, a single memory cell is arranged at the intersection point of the sub-word line and the extended bit line and the extended complementary bit line. FIG. 10 shows only the memory cells $MC_{0,j}$, $MC_{0,j+1}$, $MC_{1,j}$, $MC_{1,j+1}$, $MC_{2,j}$, $MC2,j+1$ as an example. Also, in FIG. 10, the arrangement positions of the memory cells are shown by means of dots at the intersection point of the sub-word line and the bit line and complementary bit line, and the sub-word line and the extended bit line and extended complementary bit line, and the construction of the memory cell is omitted. The memory cells are constructed for example, by means of a single transistor Q and a single capacitor C.

Each bit line and each complementary bit line are divided in two to the right and left at the intermediate ground point of the submatrixrix SM1'. For example, the left-side bit line pairs $BL_{0,R}$, $BL_{0,R-}$ are connected to the sense amplifier SA0, and the right-side bit line pairs $BL_{0,R}$, $BL_{0,R-}$ are connected to the sense amplifier SA0 by means of upper layer line pairs $ML_0$, $ML_{0-}$ that are formed on a layer that is above the bit line. $HU_0$, $HU_{0-}$ are through-holes for the purpose of connecting the upper or line pairs $ML_0$, $ML_0$ and the right side-line pairs $BL_{0,R}$, $BL_{0,R-}$.

It has the same type of construction for the other bit line pairs. Here, the bit lines that are connected to the sense amplifier by means of upper layer wiring are called the extended bit lines EXBL, and in contrast to these, the bit lines that are directly connected to the sense amplifier are called the regular bit lines. Also, this type of construction is called the extended bit line system.

The sense amplifier is connected to the bit line pairs by means of transfer gates. For example, the sense amplifier SA0 is connected to the bit line pair $BL_{0,L}$, $BL_{0,L-}$ by means of transfer gates $TG_{0,a}$, $TG_{0,a-}$, and is further connected to the extended bit line pair $BL_{0,R}$, $BL_{0,R-}$ by means of transfer gates $TG_{0,b}$, $TG_{0,b-}$. The transfer gates $TG_{0,a}$, $TG_{0,a-}$ are connected to the control signal line T4, and the transfer gates $TG_{0,b}$, $TG_{0,b-}$ are connected to the control signal line T3. The bit line pairs that are connected to the sense amplifier SA0 are selected by means of controlling the voltage level of the control signal lines T3, T4. For example, if the control signal line T3 is held low, and the control signal line T4 is held high, the transfer gates $TG_{0,a}$, $TG_{0,a-}$ become in the ON state, and the transfer gates $TG_{0,b}$, $TG_{0,b-}$ become in the OFF state, the sense amplifier SA0 and the bit line pair $BL_{0,L}$, $BL_{0,L-}$ are connected, and the upper layer wiring line pair $ML_0$, $ML_{0-}$ are disconnected from the sense amplifier SA0.

It is also the same at the other sense amplifiers. In FIG. 10, the transfer gates and the sense amplifiers are separately arranged, but in an actual circuit, the transfer gates can also be arranged within the sense amplifier. Also, it is not illustrated, but the control signal lines T1 to T8 that control the ON/OFF state of the transfer gates are connected to array control circuits AC0 and the like as is shown in FIG. 1, and are controlled by means of a decoder X within the array control circuit AC0.

Figure 11:
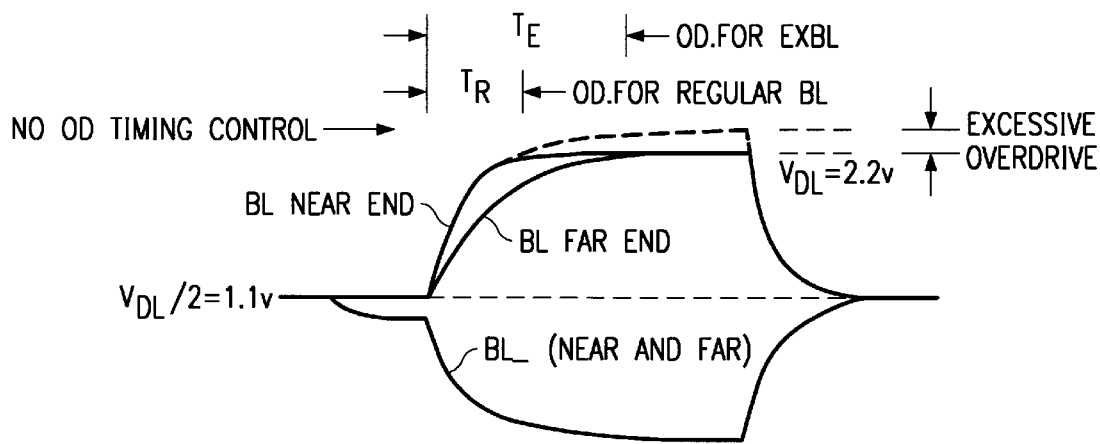
FIG. 11 is a diagram showing the changes of the bit line potential during overdrive in the regular bit line BL and the extended bit line EXBL.

FIG. 11 shows the changes of the bit line potential during overdrive at the regular bit line BL and the extended bit line EXBL. As is illustrated, the width of the pulse used for overdrive that is applied to the regular bit line BL is set to $T_R$, and the width of the pulse used for the overdrive that is applied to the extended bit line EXBL is set to $T_E$, respectively. As was mentioned above, since the extended bit line EXBL is connected to the sense amplifier by means of upper layer wiring, its load capacity is greater than the regular bit line BL, and during overdrive the width $T_E$ for the pulse used for overdrive that is applied to the extended bit line EXBL is set wider than the width $T_R$ of the pulse used for the overdrive of the regular bit line BL. As a result of this, as is shown in FIG. 11, after the overdrive operation, both the regular bit line BL and the extended bit line EXBL are charged to the internal operating voltage $V_{DL}$, and the variation in the sensing speed that originates in the difference of the load capacities of the regular bit line and the extended bit line are avoided.

In FIG. 11, the dotted line is a waveform of the potential changes of the regular bit line BL for a case wherein a timing adjustment for the overdrive was not conducted between the regular bit line BL and the extended bit line EXBL, and the timing was set for the overdrive at the extended bit line EXBL.

When the control method for the overdrive of this convention is applied to a device of the above-mentioned tiered bit line construction, at the pulse generating circuit used for overdrive shown in FIG. 3, it is necessary that it be made so that the pulse used for the overdrive for the same sense amplifier banks can be made two settings among the one used for the ordinary bit line and the one used for the extended bit line. It is not clearly shown in regard to a specific circuit construction, but like the relationship of the width of the pulses used for the overdrive of the two adjacent sense amplifier banks shown in FIG. 3, it is probably clear to a person within the industry that it is acceptable as long as it is a construction that can be made to generate a pulse used for the overdrive of the regular bit line and a pulse used for the overdrive of the extended bit line having a pulse width that is wider.

In other words, along with changing the width of the pulse used for the overdrive between each sense amplifier bank shown in FIG. 3, the width of the pulse used for the overdrive between the regular bit line pair and the extended bit line pair for the same sense amplifier bank can be varied.

As was explained above, in the semiconductor memory device of this invention, since the timing for the overdrive is controlled in response to the wiring length between the memory cell matrices and the power supply voltage supply lines, the sensing delay originating in the voltage drop in the wiring can be compensated for, each bit line can be driven to the optimum voltage by means of overdrive, and the generation of excessive overdrive for the near end can be prevented.

We claim:

1. A semiconductor memory device comprising:

a first, second, and third voltage supply node for providing a first voltage, a second voltage that is a higher than the first voltage, and a third voltage that is higher than the second voltage, a memory cell array having the memory cells arranged at intersection points of word lines and bit line pairs, and which hold charges corresponding to the first voltage and the second voltage as data, a sense amplifier block connected to the bit line pairs, having sense amplifiers that operate in response to the first voltage and the third voltage during the first period of reading the data that is stored in the memory cells, and operating in response to the first voltage and the second voltage during a second period, a first, second, and third wiring for respectively supplying the first voltage, the second voltage, and the third voltage to the sense amplifier block, and a sense amplifier drive control means that regulates the length of the first and second periods in response to the length of the wiring between the wiring for the voltage supply nodes and the sense amplifier block.

2. The semiconductor memory device of claim 1 wherein the sense amplifier drive control means controls the length of the first wiring length.

3. The semiconductor memory device of claim 1 wherein the sense amplifier drive control means contains a pulse signal generating circuit for generating a drive pulse signal of a width corresponding to the wiring length, and in which the drive controls the length of the first period.

4. The semiconductor memory device of claim 3 further comprising a delay circuit for applying a prescribed delay time to a reference pulse signal and a logic calculating circuit for generating the drive pulse signal by inputting the reference pulse signal and the output signal of the delay circuit.

5. The semiconductor memory device of claim 4 wherein the delay time of the delay signal is set to a time corresponding to the wiring length.

6. The semiconductor memory device claim 2 wherein the sense amplifier drive control means contains a pulse signal generating circuit for generating a drive pulse signal of a width corresponding to the wiring length, and in which the drive controls the length of the first period.

7. The semiconductor memory device of claim 6 further comprising a delay circuit for applying a prescribed delay time to a reference pulse signal and a logic calculating circuit for generating the drive pulse signal by inputting the reference pulse signal and the output signal of the delay circuit.

8. The semiconductor memory device of claim 7 wherein the delay time of the delay signal is set to a time corresponding to the wiring length.

* * * * *